United States Patent
Russell et al.

(10) Patent No.: US 6,372,592 B1
(45) Date of Patent: *Apr. 16, 2002

(54) SELF-ALIGNED MOSFET WITH ELECTRICALLY ACTIVE MASK

(75) Inventors: Stephen D. Russell; Douglas A. Sexton; Bruce W. Offord; George P. Imthurn, all of San Diego, CA (US)

(73) Assignee: United States of America as represented by the Secretary of the Navy, Washington, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/768,694

(22) Filed: Dec. 18, 1996

(51) Int. Cl.[7] .............................................. H01L 21/336
(52) U.S. Cl. ...................... 438/308; 438/149; 438/166; 438/795; 257/57; 257/66; 257/347; 257/352; 257/410; 257/411; 257/412
(58) Field of Search ........................... 257/57, 66, 347, 257/352, 410, 411, 412; 438/149, 166, 795, 308; 148/DIG. 53

(56) References Cited

U.S. PATENT DOCUMENTS

| | | |
|---|---|---|
| 4,431,459 A | 2/1984 | Teng |
| 4,434,013 A | 2/1984 | Bol |
| 4,468,855 A | 9/1984 | Sasaki |
| 4,579,600 A | 4/1986 | Shah et al. |
| 4,619,034 A | 10/1986 | Janning |
| 4,619,036 A | 10/1986 | Havemann et al. |
| 4,621,411 A | 11/1986 | Havemann et al. |
| 4,630,089 A | 12/1986 | Sasaki et al. |
| 4,646,426 A * | 3/1987 | Sasaki |
| 4,679,299 A | 7/1987 | Szluk et al. |
| 4,758,533 A | 7/1988 | Magee et al. |
| 4,822,752 A | 4/1989 | Sugahara et al. |
| 4,849,365 A | 7/1989 | Gifford |
| 5,173,446 A | 12/1992 | Asakawa et al. |
| 5,241,211 A * | 8/1993 | Tashiro |
| 5,306,651 A | 4/1994 | Masumo et al. |
| 5,366,926 A | 11/1994 | Mei et al. |
| 5,401,666 A * | 3/1995 | Tsukamoto |
| 5,583,369 A * | 12/1996 | Yamazaki et al. |
| 5,608,251 A * | 3/1997 | Konuma et al. |
| 5,904,509 A * | 5/1999 | Zhang et al. |

FOREIGN PATENT DOCUMENTS

EP 0650197 A2 * 4/1995

OTHER PUBLICATIONS

P.G. Carey et al., A Shallow Junctions Submicrometer PMOS w/out high–temp anneals, (IEEE), pp. 542–544, 1988.*

"Laser–Assisted MOS/SOS Transistor Fabrication" by L. D. Hess et al, Hughes Research Lab., pp. 633–638, 1982.

"CW Laser Annealing of Ion Implanted Oxidized Silicon Layers on Sapphire", by G. Alestig et al, Dept. of Physics, Chalmers Univ. of Technology, pp. 517–522, 1983.

* cited by examiner

Primary Examiner—Long Pham
Assistant Examiner—Scott Brairton
(74) Attorney, Agent, or Firm—Harvey Fendelman; Michael A. Kagan; Eric James Whitesell

(57) ABSTRACT

A method for making a self-aligned FET with an electrically active mask comprises the steps of forming a semiconductor layer on an insulating substrate, forming an electrically nonconductive oxide layer on the semiconductor layer, forming an electrically conductive metal layer on the oxide layer, patterning the metal layer and the oxide layer to form an electrically active gate on semiconductor layer, introducing dopants into the semiconductor layer to form a source region and a drain region masked by the metal gate, and illuminating the source and the drain regions with a pulsed excimer laser having a wavelength from about 150 nm to 350 nm to anneal the source region and the drain region.

2 Claims, 6 Drawing Sheets

SELF-ALIGNED MOSFET WITH ELECTRICALLY ACTIVE MASK

BACKGROUND OF THE INVENTION

The present invention relates to the fabrication of MOSFETs. More specifically, but without limitation thereto, the present invention relates to the fabrication of an electrically active MOSFET gate that may serve to mask laser radiation during annealing to form a self-aligned semiconductor structure.

The recent growth in the personal communications market has produced a rise in interest in inexpensive low power, high frequency, low noise electronic devices and circuits. FIG. 1 shows a model of a FET typically used to predict high frequency performance. In making a FET it is desirable to reduce the series resistance of the gate, source, and drain, shown respectively as Rg, Rs, and Rd, and to keep the gate-to-drain capacitance Cgd as low as possible in order to reduce device noise and to improve high frequency performance. Rg, Rs, Rd, and Cgd are known as parasitic resistance and capacitance.

Three typical FET structures are diagrammed in FIG. 2. Dopants are typically incorporated into a semiconductor or a semiconductor alloy by ion implantation, diffusion, gas immersion techniques, and the like to form source and drain regions in a FET structure. However, dopant incorporation disrupts the crystalline structure of the semiconductor or alloy. Annealing the semiconductor structure corrects the damage and places the dopants in electrically active crystal sites. Annealing, also called activation of the implant, is well known in the art of microelectronic fabrication. The method usually used to activate an implant is to heat the entire substrate to a high temperature for a given period of time.

In the FET structure of FIG. 2(a), gate 204 overlaps source 202 and drain 206. Gate 204 comprises a gate insulator 210 and a gate conductive layer 208. The increased contact area reduces the parasitic resistances, but also increases the gate-to-drain capacitance. Another problem with this structure is that the most important parameter affecting FET performance, the gate length $L_g$, is relatively large, while optimum (high-speed) performance is achieved by making the gate length as small as possible.

In FIG. 2(b), the gate-to-drain capacitance has been reduced by reducing the gate length below the distance separating the source and drain regions. However, the gap between source 202 and drain 206 has been increased to relieve the mask alignment constraints, which increases Rs and Rd.

A solution to the problem of reducing Cgd, Rg, and Rd while still satisfying the mask alignment constraints is to use a self-aligned process as in FIG. 2(c). In a self-aligned process, the gate is used as a mask during the source and the drain implanting. In the structures of FIG. 2(a) and FIG. 2(b), a separate photolithographic mask alignment step is typically required for the ion implants and the gate. By using a self-aligned process, shorter gate lengths may be fabricated while reducing the separation between source 202 and drain 206 to the gate length $L_g$, thus reducing the source and drain resistances.

Selecting a suitable material for gate conductive layer 208 poses a problem for the self-aligned process, however. A highly conductive metal such as aluminum or gold would be desirable in a self-aligned FET gate to reduce the gate series resistance Rg, but the high temperatures required for the source and drain implant activations (typically well above 500° C.) would cause aluminum and gold to melt. Materials typically used for conductive layer 208 in a self-aligned process therefore have higher melting temperatures than most metals. Examples of such conductive layer materials are refractory metals such as doped polycrystalline silicon, titanium silicide, platinum silicide, tungsten silicide, and the like. The problem with using polysilicon or other refractory metals is that they have a higher resistivity than the lower melting temperature metals. As a result, Rg is increased, which causes a degradation of transistor performance. The refractory metals may be used, however, for the source and drain regions to reduce series resistance Rs.

While group III–V semiconductors have dominated the field of devices and circuitry in the personal communications market, silicon-on-insulator (SOI) materials, including silicon-on-sapphire (SOS), have recently been demonstrated as a lower cost alternative. SOI materials are preferable to bulk silicon for such applications due to their reduced parasitic capacitance. However, complex fabrication techniques are required to reduce the gate resistance in the typical case of a T-gate structure 30 illustrated in FIG. 3. The complexity of fabricating T-gate 310 in FIG. 3 is shown by the steps depicted in FIG. 4. T-gate 310 comprises a sidewall oxide 320, a barrier layer 330, a conductive layer 340, and a gate metal 350.

FIG. 4(a) shows a cross-section of a self-aligned FET formed by siliciding source, drain, and gate regions 412, depositing oxide 414, and forming a planar resist layer 416. In FIG. 4(b), planar resist layer 416 and oxide layer 414 have been etched to expose the top of T-gate 310. This is followed by etching contact holes 432 in oxide 414, and deposition and patterning of final metallization 418 as illustrated in FIG. 4(c).

The above description is a simplified version of the actual steps in the fabrication of a microelectronic device. Even the simplest patterning involves numerous steps that are time consuming, labor intensive, and have an associated yield, or failure rate. In a typical example of patterning, a semiconductor wafer is dipped in a solution to prime the surface and to increase adhesion of the photoresist. Photoresist, a light-sensitive polymer, is then spin-cast on the wafer and subjected to a hot plate bake to eliminate solvents. The photoresist is cured by annealing and exposed to light passed through a lithographic pattern on a mask or reticle using projection or contact photolithography apparatus. The exposed photoresist is developed by immersion in one or more chemical baths, then rinsed and dried. In some cases, additional ultraviolet (UV) light curing is required to harden the photoresist to withstand subsequent processing. The wafer containing the photoresist is subjected to etching by well known methods such as wet chemical, plasma/reactive-ion assisted, and laser-assisted etching to transfer the photolithographic pattern to the underlying layer. The patterned photoresist is then removed using, for example, wet chemical processing, plasma-assisted cleaning, or a combination of these. The structure of T-gate 310 in FIG. 3 requires several such patterning steps.

Any reduction or elimination of steps in the fabrication process to increase yield is highly desirable because there is a corresponding reduction in cost, particularly in the final steps of the fabrication process where the semiconductor manufacturer already has a substantial investment in the wafer components. Improvements or refinements in the step of FET gate metallization are therefore especially cost effective.

Laser activation of ion implanted dopants has been recognized as an alternative to conventional furnace annealing, and techniques such as Gas Immersion Laser Doping (GILD) have proven valuable in the forming of shallow junctions in bulk silicon. See, for example, "Gas Immersion Laser Diffusion (GILDing)", R. J. Pressley, *Laser Processing of Semiconductor Devices*, Proc. SPIE, Vol. 385, p. 30 (1983).

Thermally-assisted pulsed laser annealing of SOS was reported in "Thermally-Assisted Pulsed-Laser Annealing of SOS", M. Yamada et al., *Laser and Electron-Beam Interactions with Solids and Materials Processing*, Mat. Res. Soc. Symp. Proc., Vol. 1, pp. 503–510 (1981). Using Raman spectroscopy they measured the residual strain in annealed SOS due to the lattice mismatch between silicon and sapphire.

Continuous wave (CW) laser annealing of ion implanted oxidized silicon layers on sapphire was reported in "CW Laser Annealing of Ion Implanted Oxidized Silicon Layers on Sapphire", G. Alestig et al., *Laser-Solid Interactions and Thermal Transient Thermal Processing of Materials*, Mat. Res. Soc. Symp. Proc., Vol. 13, pp. 517–522 (1983). Activation of boron and phosphorus dopants was effected by illumination from both the top and backside of the wafer. Visible damage was reported when using power sufficient to melt the silicon. Similarly, CW laser annealing of SOS to activate ion implanted dopant into MOS devices was reported in "Laser-Assisted MOS/SOS Transistor Fabrication", L. D. Hess et al., *Laser and Electron-Beam Interactions with Solids*, Mat. Res. Soc. Symp. Proc., Vol. 4, pp. 633–638 (1982). To prevent diffusion of dopant from the source or drain region into the gate region, the silicon was not annealed. These references avoid annealing SOS to prevent undesired diffusion of dopant, and report decreased crystalline quality under these conditions.

U.S. Pat. No. 4,468,855 issued on Sep. 4, 1984 to Sasaki teaches the use of a laser to anneal the source and drain regions of an aluminum gate MOSFET using the aluminum gate as a masking material. An insulating layer is used on the aluminum gate electrode to prevent thermal damage during laser irradiation.

U.S. Pat. No. 4,646,426 issued on Mar. 3, 1987 to Sasaki also teaches the use of a laser to anneal the source and drain regions of an aluminum gate MOSFET using the aluminum gate as a masking material, but without requiring the insulating layer to protect the aluminum gate from thermal damage during laser irradiation. In this reference a laser wavelength of over 900 nm is used to avoid absorption by the aluminum gate, antireflective coatings are added to increase absorption in the source and drain regions, and the substrate is heated to between 200° C. and 300° C. to facilitate annealing.

Other methods include direct laser illumination of the semiconductor, patterned projection of the laser beam upon the semiconductor and using a reflective mask on the wafer during laser illumination which is subsequently removed. However, these methods are inconsistent with the requirements of a high-speed self-aligned FET. Therefore, there is a continued need to eliminate or reduce the numerous fabrication steps, even when using laser processing techniques, and to improve the performance characteristics of FET's.

SUMMARY OF THE INVENTION

The method of fabricating a self-aligned FET with an electrically active mask of the present invention is directed to overcoming the problems described above, and may provide further related advantages. No embodiment of the present invention described herein shall preclude other embodiments or advantages that may exist or become obvious to those skilled in the art.

A method for fabricating a self-aligned FET with an electrically active mask of the present invention comprises the steps of forming a semiconductor layer on an insulating substrate, forming an electrically nonconductive oxide layer on the semiconductor layer, forming an electrically conductive metal layer on the oxide layer, patterning the metal layer and the oxide layer to form an electrically active gate on semiconductor layer, introducing dopants into the semiconductor layer to form a source region and a drain region masked by the metal gate, and illuminating the source and the drain regions with a pulsed excimer laser having a wavelength from about 150 nm to 350 nm to anneal the source region and the drain region.

An advantage of the method of the present invention is that sufficient laser power for incorporating and activating dopants from the gas phase or activating ion implanted dopants may be used without thermal damage to a highly conductive metal gate.

Another advantage is that the problem of reducing the gate to drain capacitance is solved by the self-alignment of the gate.

Yet another advantage is that the present invention reduces the number of steps required to fabricate a self-aligned FET over previous FET fabrication methods, thus increasing the yield and lowering manufacturing costs.

Still another advantage is that high-performance MOSFETS may be fabricated on a common sapphire substrate with display electrodes for liquid crystal displays.

Another advantage is that high-frequency MOSFETs used in transceiver circuits for personal communications systems may be integrated with low power digital microelectronics on the same substrate.

The features and advantages summarized above in addition to other aspects of the present invention will become more apparent from the description, presented in conjunction with is the following drawings.

DESCRIPTION OF THE INVENTION

The following description is presented solely for the purpose of disclosing how the present invention may be made and used. The scope of the invention is defined by the claims.

Figure 1:
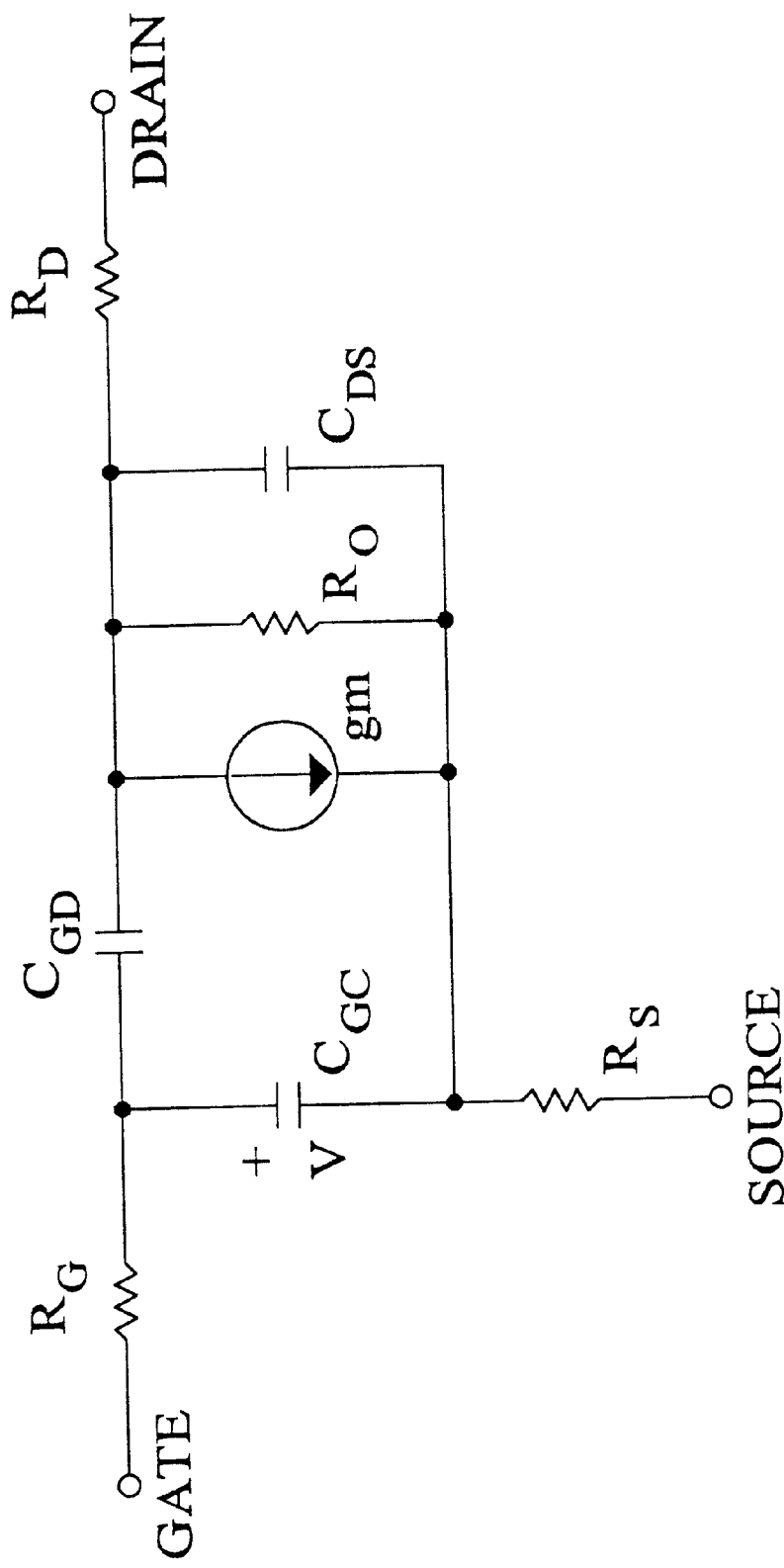
FIG. 1 is an electrical schematic of an FET.
Figure 2A:
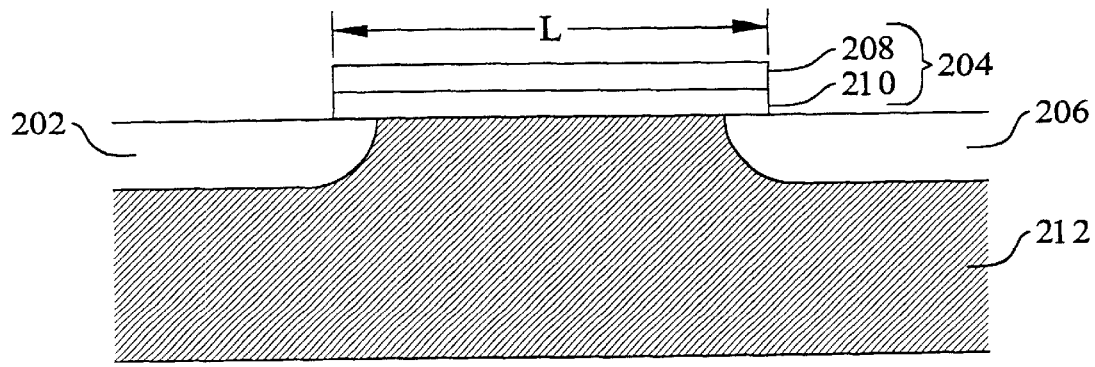
FIG. 2 is an illustration of FET construction techniques of the prior art.
Figure 2B:
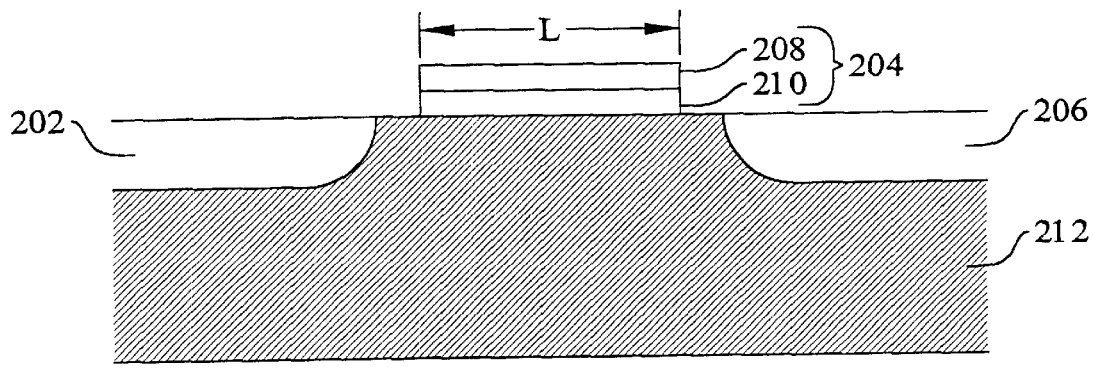
Figure 2C:
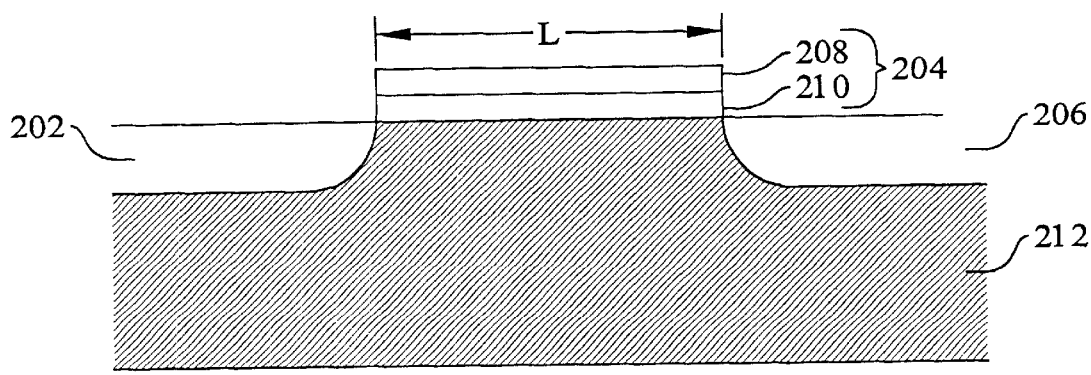
Figure 3:
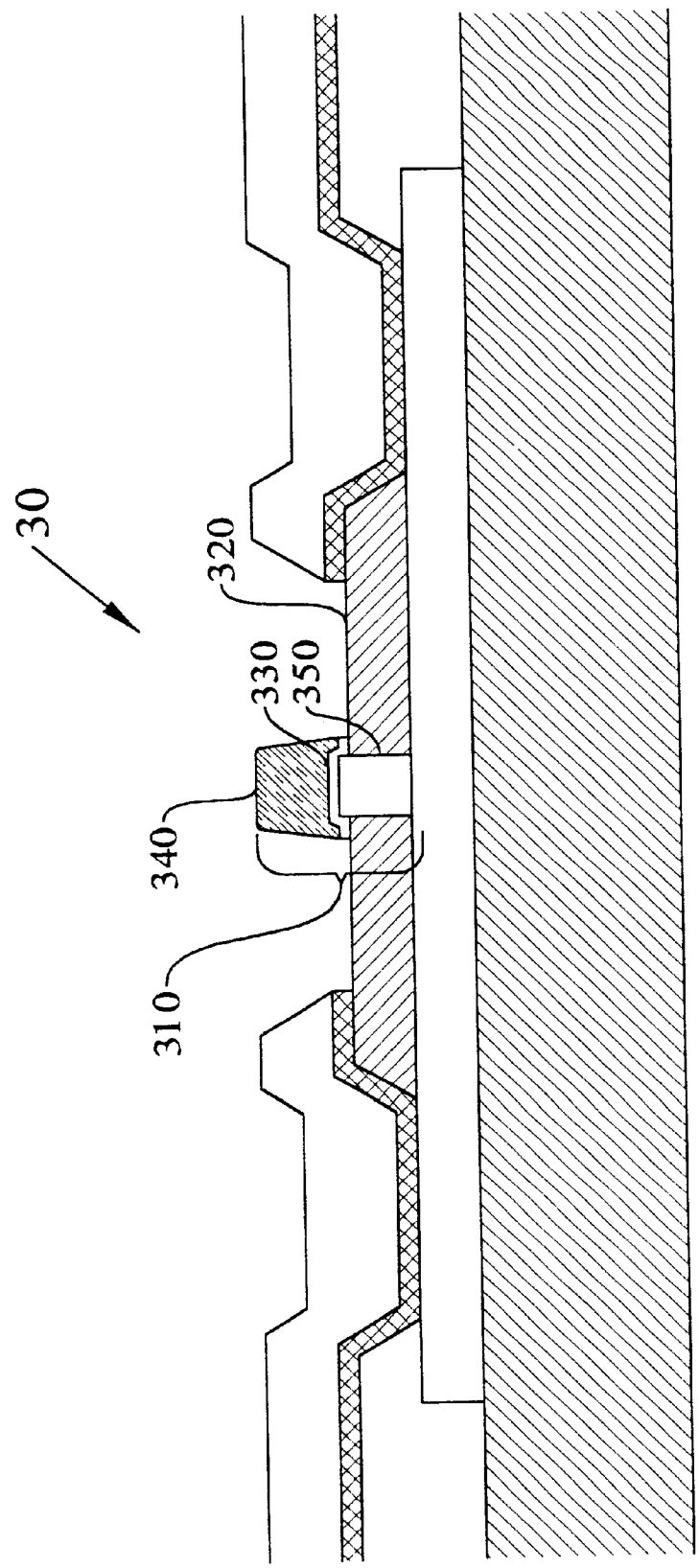
FIG. 3 is an illustration of a T-gate structure of the prior art.
Figure 4A:
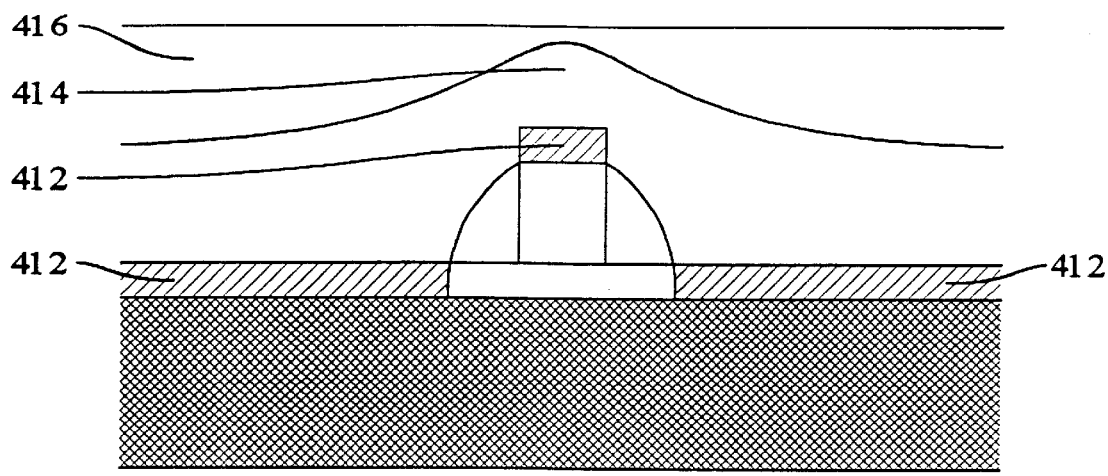
FIG. 4 is an illustration of a process for fabricating a self-aligned T-gate FET structure of the prior art.
Figure 4B:
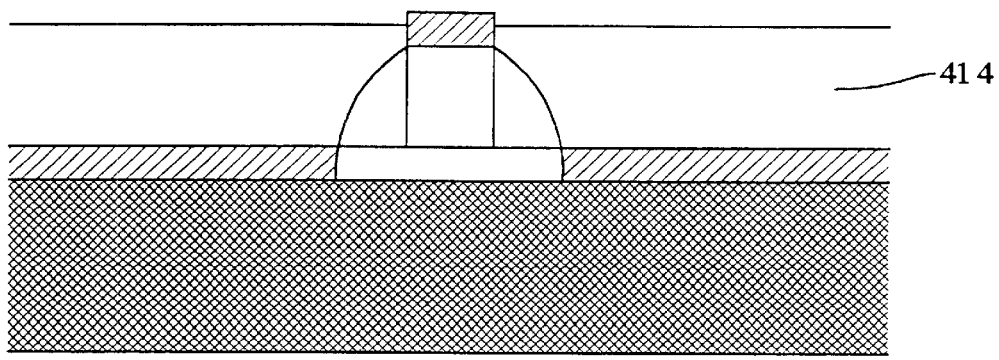
Figure 4C:
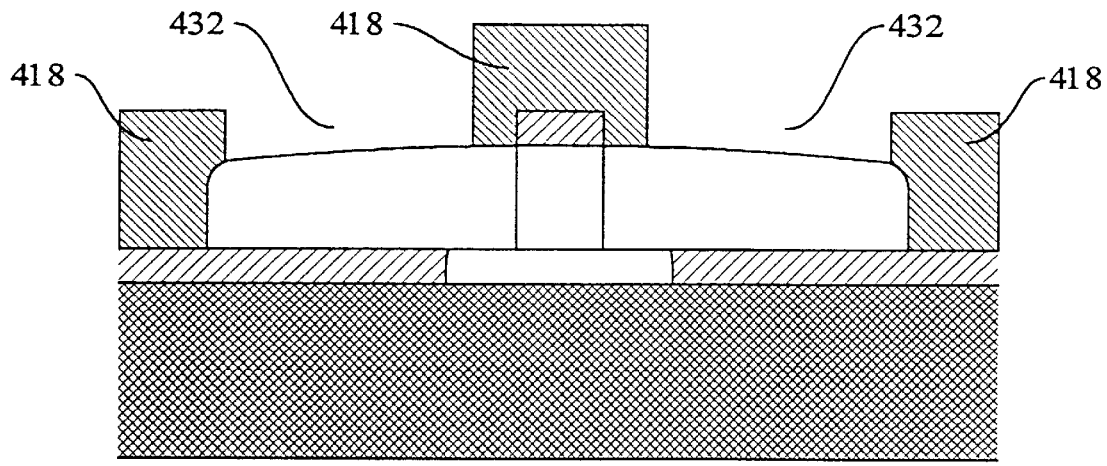
Figure 5A:
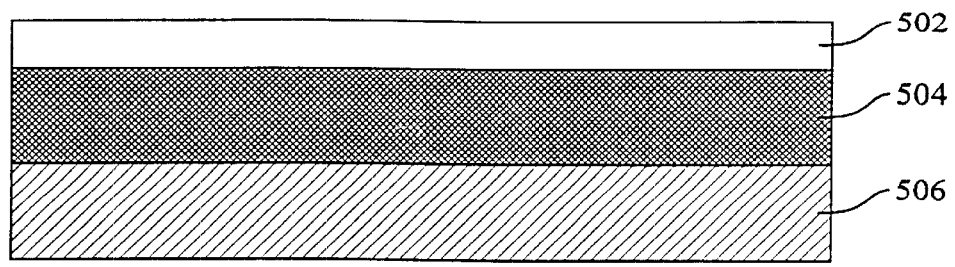
FIG. 5 is an illustration of a self-aligned FET of the present invention.
Figure 5B:
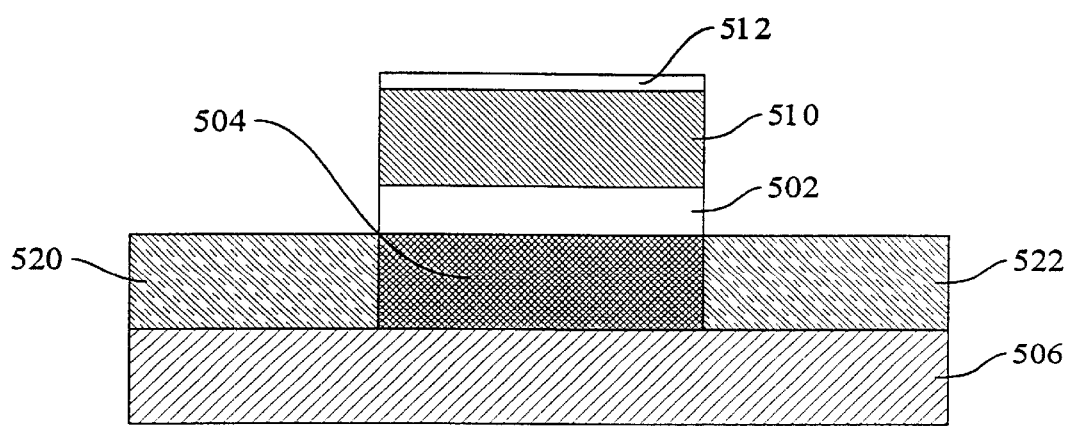

In FIG. 5(a) a layer of silicon 504 is formed on an insulating layer 506 and a gate oxide layer 502 is formed on silicon layer 504 according to well-known techniques. Insulating layer 506 may be made of, for example, sapphire, diamond, quartz, silicon dioxide, yttria-stabilized zircona, and the like. In FIG. 5(b) a highly conductive metal such as aluminum or an aluminum alloy of, for example, 99% aluminum and 1% silicon, is formed on gate oxide layer 502 and appropriately patterned to form a gate 510. Typical thicknesses are 400 nm for gate 510, less than about 25 nm for gate oxide layer 502, and less than about 1 micron for silicon layer 504. Dopants may then be implanted according to well known techniques to form a source region 520 and a drain region 522 masked by gate 510 in a self-aligned gate structure. A photoresist layer 512 may be used to protect gate 510 until after etching gate oxide layer 502 as shown in FIG. 5(b).

Figure 5C:
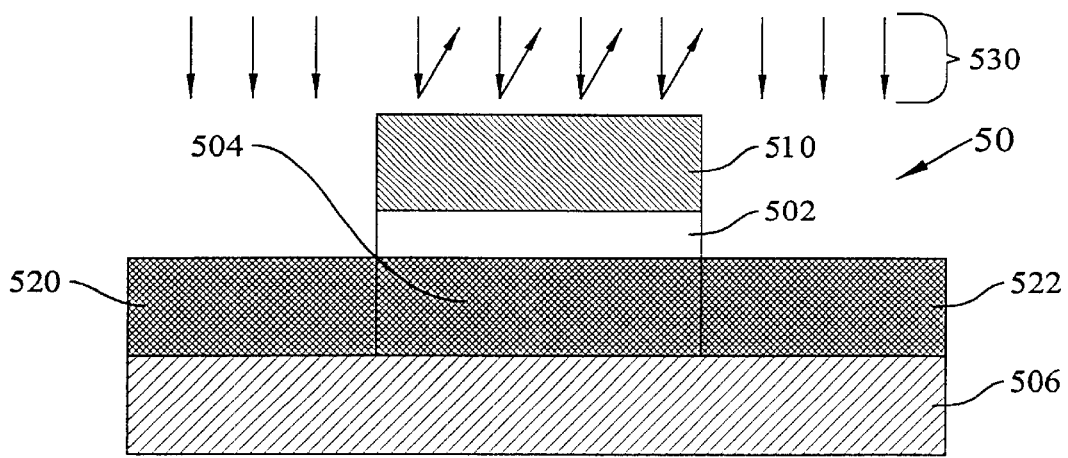

Dopants in source region 520 and drain region 522 are activated by illuminating the surface of self-aligned gate structure 50 in FIG. 5(c) with a laser beam 530. Laser beam 530 has sufficient power-of suitable wavelength. to be absorbed by source region 520 and drain region 522 for annealing while being reflected by gate 510 to prevent thermal damage that could increase the sheet resistivity. The annealing step includes a rapid melting and recrystallizing of source region 520 and drain region 522 only. Laser beam 530 may be generated, for example, by an excimer laser having a wavelength of from about 150 nm to 351 nm. Typical parameters for laser beam 530 are a nominal wavelength of 248 nm and a number of pulses ranging from 1 to 50 with a pulse duration of nominally 25 ns. The energy density of laser beam 530 is typically within the range 0.5 $J/cm^2$ to 2.5 $J/cm^2$.

An advantage of the excimer laser is that the nanosecond pulses it generates result in localized heating of the device and a correspondingly low fabrication temperature, typically an ambient temperature of 25° C., thus avoiding thermal damage to the gate and an accompanying increase in sheet resistivity. Another advantage of the excimer laser is that the nanosecond time scale during which recrystallization occurs inhibits the lateral diffusion of dopants under the gate region, resulting in sharp lateral junctions in contrast to the junctions formed in the prior art. The sharp lateral junctions of the present invention thus accurately define the short gate lengths required for high-speed device applications with high reproducibility. Additional processing steps well known in the art of fabricating microelectronic devices may be performed after activation of the implants, such as passivation and contact fabrication. Unlike the prior art, gate 510 serves both as a mask for laser beam 530 and as electrically active gate in the self-aligned gate structure of an FET. Since gate 510 is not removed after performing the masking function, an additional processing step is saved.

Figure 6:
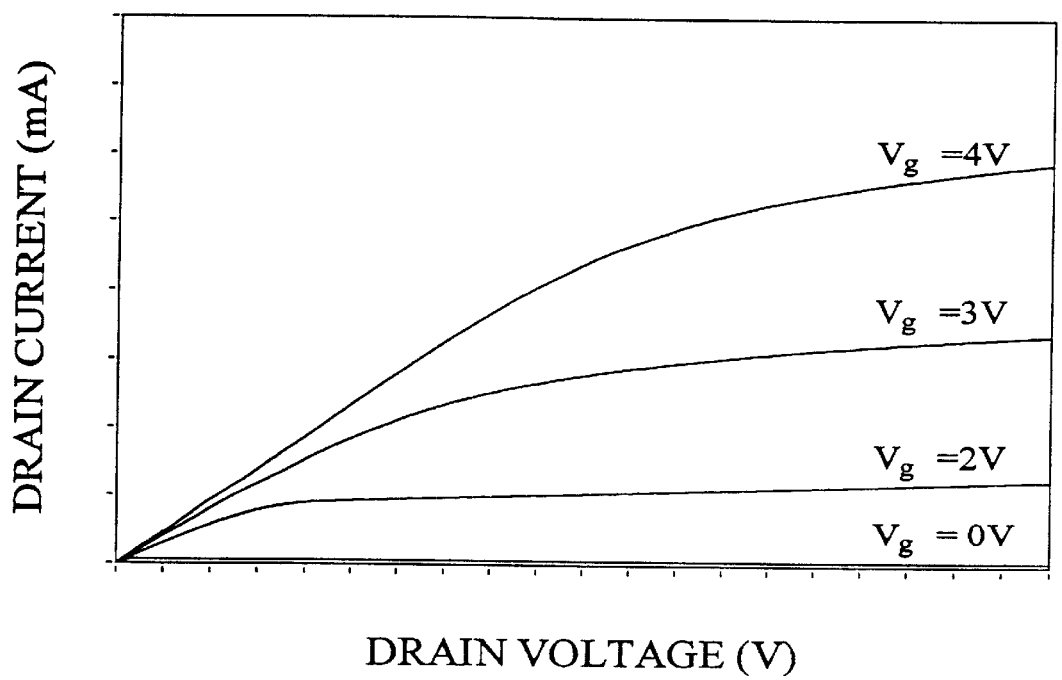
FIG. 6 is an exemplary plot of drain current versus voltage for a self-aligned FET of the present invention.

FIG. 6 is a plot of characteristic curves of drain voltage vs drain current as a function of gate bias typical of a NMOS transistor having a self-aligned gate structure fabricated on a 900 nm thick silicon-on-sapphire (SOS) wafer as described above.

The self-aligned gate of the present invention may also be extended to other FET device structures comprising sidewall spacers, multiple gates, lightly doped drains, refractory metal sources and drains made of for example, B-doped titanium silicide ($TiSi_2$) platinum silicide ($PtSi_2$) cobalt silicide ($CoSi_2$), and the like. Exposing the source and drain regions to appropriate laser illumination after depositing a layer of a refractory metal such as Ti, Pt, or Co onto the source and drain regions can form the refractory metal silicide. Similarly, other materials such as silicon-on-insulator (SOI), bulk silicon, germanium, and group IV semiconductor alloys may is be used to practice the present invention. The processing steps may also be varied, for example, by replacing the combined step of ion implantation and laser annealing with a GILD process. The laser beam may also be patterned by, for example, a reticule or a lithographic mesh or by a flood illumination projector.

Other modifications, variations, and applications of the present invention may be made in accordance with the above teachings other than as specifically described to practice the invention within the scope of the following claims.

We claim:

1. A method for fabricating a self-aligned semiconductor structure, comprising the steps of:

forming a semiconductor layer on an insulating substrate;

forming an electrically nonconductive oxide layer on the semiconductor layer;

forming an electrically conductive metal layer on the oxide layer;

removing the metal layer and the oxide layer from a portion of the semiconductor layer to form an electrically-active metal gate aligned to define a source region and a drain region in the semiconductor layer;

incorporating dopants into the source region and the drain region; and annealing the source region and the drain region of the semiconductor layer to activate the respective implanted dopants by exposing the unmasked surface of the semiconductor structure to a beam of radiation having a peak surface energy density greater than about 500 $mJ/cm^2$ and a wavelength from about 150 nm to about 350 nm that is reflected by the unmasked surface of the metal gate, wherein the metal gate temperature does not exceed about 25° C. during the annealing step.

2. A method for fabricating a self-aligned semiconductor structure, comprising the steps of:

forming a semiconductor layer on an insulating substrate;

forming an electrically nonconductive oxide layer on the semiconductor layer;

forming an electrically conductive metal layer on the oxide layer;

removing the metal layer and the oxide layer from a portion of the semiconductor layer to form an electrically-active metal gate aligned to define a source region and a drain region in the semiconductor layer;

exposing an unmasked surface of the semiconductor structure to a gas comprising semiconductor dopants;

illuminating the unmasked surface of the semiconductor structure with a beam of radiation that is reflected by the unmasked surface of the metal gate, thereby diffusing the semiconductor dopants into the source region and the drain region of the semiconductor layer and annealing the source region and the drain region of the semiconductor layer, wherein the beam of radiation has peak surface energy density greater than about 500 $mJ/cm^2$ and a wavelength from about 150 nm to about 350 nm and wherein the metal gate temperature does not exceed about 25° C. during the illuminating step.

* * * * *